United States Patent
Kim et al.

(10) Patent No.: US 7,838,872 B2
(45) Date of Patent: Nov. 23, 2010

(54) ORGANIC THIN FILM TRANSISTOR ARRAY PANEL

(75) Inventors: Bo-Sung Kim, Seoul (KR); Yong-Uk Lee, Gyeonggi-do (KR); Mun-Pyo Hong, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 577 days.

(21) Appl. No.: 11/368,249

(22) Filed: Mar. 3, 2006

(65) Prior Publication Data

US 2006/0202199 A1    Sep. 14, 2006

(30) Foreign Application Priority Data

Mar. 9, 2005    (KR) .................. 10-2005-0019616

(51) Int. Cl.
*H01L 29/08* (2006.01)
(52) U.S. Cl. .................. 257/40; 257/72; 438/99; 349/46
(58) Field of Classification Search .................. 257/40, 257/72; 438/99; 313/500, 506; 349/44, 349/46, 47, 52
See application file for complete search history.

(56) References Cited

U.S. PATENT DOCUMENTS

| 5,299,041 | A | 3/1994 | Morin et al. | |
|---|---|---|---|---|
| 5,950,077 | A | 9/1999 | Ohue et al. | |
| 6,661,476 | B1 | 12/2003 | Abe et al. | |
| 2002/0179901 | A1* | 12/2002 | Arai et al. | 257/40 |
| 2004/0023447 | A1 | 2/2004 | Hirakata et al. | |
| 2004/0119399 | A1* | 6/2004 | Nagayama | 313/500 |
| 2004/0126941 | A1* | 7/2004 | Yukawa | 438/160 |
| 2006/0081849 | A1* | 4/2006 | Lee et al. | 257/72 |

FOREIGN PATENT DOCUMENTS

| CN | 1314608 A | 9/2001 |
|---|---|---|
| CN | 1364323 A | 8/2002 |
| CN | 1577014 | 2/2005 |
| JP | 2-268467 | 11/1990 |
| JP | 2002-9290 | 1/2002 |
| JP | 2003-158134 | 5/2003 |
| JP | 2003-309268 | 10/2003 |
| JP | 2004-6750 | 1/2004 |

(Continued)

OTHER PUBLICATIONS

Patent Abstracts of Japan, Publication No. 2002-009290, Jan. 11, 2002, 1 p.

(Continued)

*Primary Examiner*—Kiesha R Bryant
*Assistant Examiner*—Tucker Wright
(74) *Attorney, Agent, or Firm*—Innovation Counsel LLP

(57) ABSTRACT

An organic thin film transistor array panel according to an embodiment of the present invention includes: a substrate; a data line disposed on the substrate; an insulating layer disposed on the data line and having a contact hole exposing the data line; a first electrode disposed on the insulating layer and connected to the data line through the contact hole; a second electrode disposed on the insulating layer; an organic semiconductor disposed on the first and the second electrodes; a gate insulator disposed on the organic semiconductor; and a gate electrode disposed on the gate insulator.

17 Claims, 21 Drawing Sheets

FOREIGN PATENT DOCUMENTS

| | | |
|---|---|---|
| JP | 2004-177972 | 6/2004 |
| JP | 2004-200365 | 7/2004 |
| JP | 2004-318058 | 11/2004 |
| KR | 10-0351009 | 7/1996 |
| KR | 2000-0068382 | 11/2000 |
| KR | 2001-0054687 | 7/2001 |
| KR | 2002-0066370 | 8/2002 |

OTHER PUBLICATIONS

Patent Abstracts of Japan, Publication No. 2003-158134, May 30, 2003, 1 p.
Patent Abstracts of Japan, Publication No. 2003-309268, Oct. 31, 2003, 1 p.
Patent Abstracts of Japan, Publication No. 2004-006750, Jan. 8, 2004, 2 pp.
Patent Abstracts of Japan, Publication No. 2004-177972, Jun. 24, 2004, 1 p.
Patent Abstracts of Japan, Publication No. 2004-200365, Jul. 15, 2004, 1 p.
Patent Abstracts of Japan, Publication No. 2004-318058, Nov. 11, 2004, 2 pp.
Abstract of Korean Patent, Patent No. 10-0351009, Jul. 22, 1996, 1 p.
Abstract of WO9901857, (Korean Publication No. 2000-0068382, Nov. 25, 2000), 1 p.
Korean Patent Abstracts, Publication No. 1020010054687, Jul. 2, 2001, 1 p.
Abstract of WO0079617, (Korean Publication No. 2002-0066370, Aug. 16, 2002), 1 p.

* cited by examiner

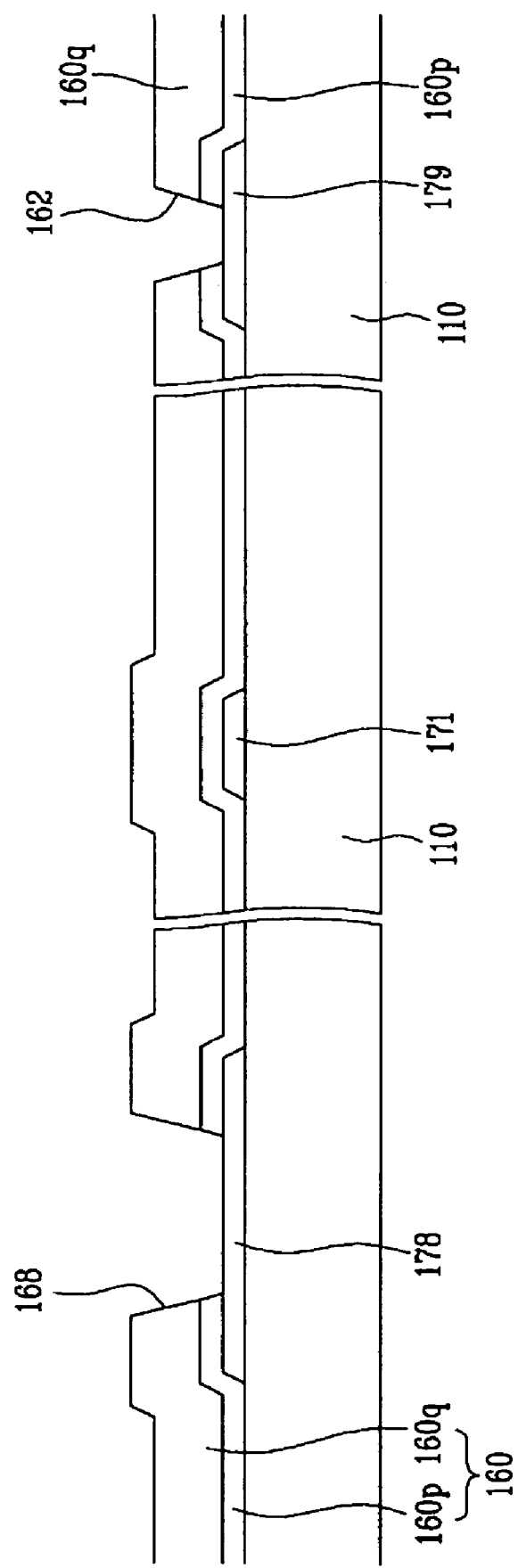

ORGANIC THIN FILM TRANSISTOR ARRAY PANEL

BACKGROUND OF THE INVENTION (a) Field of the Invention

The present invention relates to organic thin film transistor array panels and a method for manufacturing such panels.

(b) Description of Related Art

Organic thin film transistors (OTFT's) are being vigorously developed for use as driving elements in next-generation display devices.

An OTFT includes an organic active layer instead of an inorganic semiconductor such as Si. In particular, since organic insulating material can be easily deposited in the form of a fiber or film at low temperatures by spin coating or vacuum evaporation, the OTFT is viewed as a significant component in flexible display devices.

However, organic active layers are very sensitive to process conditions, and OTFT's have other characteristics that need to be improved.

SUMMARY OF THE INVENTION

An organic thin film transistor array panel according to an embodiment of the present invention includes: a substrate; a data line disposed on the substrate; an insulating layer disposed on the data line and having a contact hole exposing the data line; a first electrode disposed on the insulating layer and connected to the data line through the contact hole; a second electrode disposed on the insulating layer; an organic semiconductor disposed on the first and the second electrodes; a gate insulator disposed on the organic semiconductor; and a gate electrode disposed on the gate insulator.

The organic thin film transistor array panel may further include a layer of insulating material enclosing the organic semiconductor. The layer of insulating material may also enclose the gate insulator and may include an insulating organic material. The bank may have an opening exposing a portion of the second electrode.

The organic semiconductor may include polythienylenevinylene, oligothiophene, poly 3-hexylthiophene, or soluble pentacene.

The gate insulator may include hydrocarbon compound including fluorine, polyvinyl alcohol, or polyimide.

The interlayer insulating layer may include a silicon nitride film and an organic film.

The organic thin film transistor array panel may further include a conductive light blocking member disposed under the semiconductor.

The organic thin film transistor array panel may further include a passivation member disposed on the gate electrode.

The organic thin film transistor array panel may further include: a storage connection disposed on the substrate; and a storage electrode line disposed on the same layer as the gate line and connected to the storage connection.

A method of manufacturing an organic thin film transistor array panel according to an embodiment of the present invention includes: forming data lines; depositing an interlayer insulating layer on the data lines; forming contact holes exposing portions of the data lines in the interlayer insulating layer; forming source electrodes electrically connected to the data lines through the contact holes, and pixel electrodes including drain electrodes; forming a second insulating layer having first openings exposing a portion of the source electrodes and the drain electrodes; forming organic semiconductors in the first openings; forming gate insulators on the organic semiconductors in the first openings; and forming gate electrodes on the gate insulators.

The organic semiconductors may be formed by inkjet printing.

The organic semiconductors may be formed by printing organic semiconductor material dissolved in a solvent, and removing the solvent.

The formation of the gate insulator may include inkjet printing.

The second insulating layer may further have second openings exposing portions of the pixel electrodes.

The formation of source electrodes and pixel electrodes may include: depositing an indium tin oxide (ITO) layer at a room temperature; and patterning the ITO layer by lithography and etch.

The patterning of the ITO layer may use an etchant containing an alkaline ingredient.

The formation of the interlayer insulating layer may include: forming a silicon nitride film; and forming an organic film on the silicon nitride film.

The method may further include: forming passivation members on the gate electrodes.

BRIEF DESCRIPTION OF THE DRAWINGS

The present invention will become more apparent by describing embodiments thereof in detail with reference to the accompanying drawings in which:

FIGS. 7A and 7B are sectional views of the TFT array panel shown in FIG. 6 taken along lines 7A-7A' and 7B-7B';

DETAILED DESCRIPTION OF EMBODIMENTS

Figure 1:
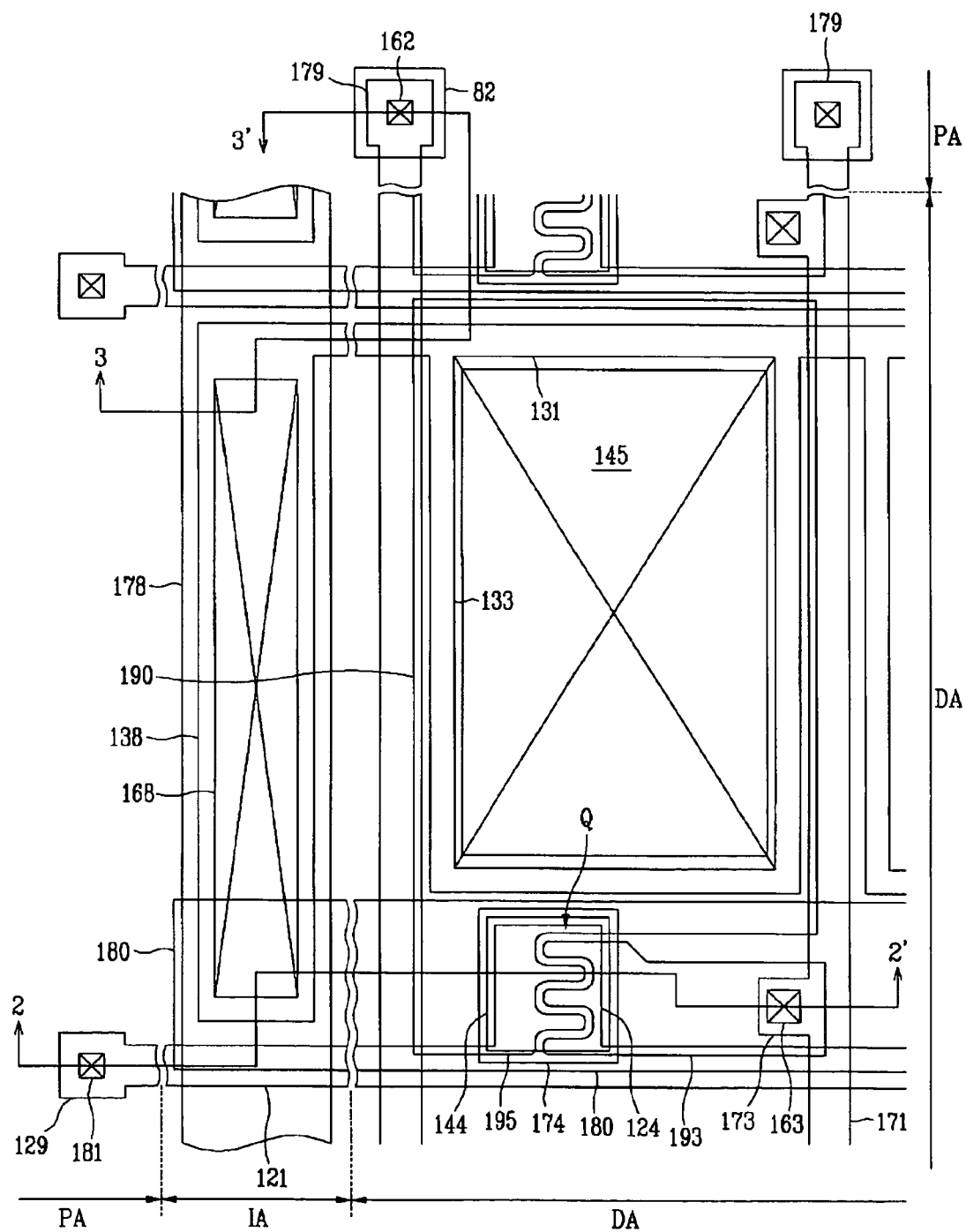
FIG. 1 is a layout view of an organic TFT array panel according to an embodiment of the present invention.

The present invention is described in detail herein with reference to the accompanying drawings, in which preferred embodiments of the invention are shown. This invention may, however, be embodied in many different forms and should not be construed as limited to the embodiments set forth herein. Like numerals refer to like elements throughout.

In the drawings, the thickness of layers and regions are exaggerated for clarity. Like numerals refer to like elements throughout. When an element such as a layer, region or substrate is referred to as being "on" another element, it can be directly on the other element or intervening elements may also be present. In contrast, when an element is referred to as being "directly on" another element, there are no intervening elements present.

An organic TFT array panel for a liquid crystal display according to an embodiment of the present invention will be described in detail with reference to FIGS. 1, 2 and 3.

FIG. 1 is a layout view of an organic TFT array panel according to an embodiment of the present invention. FIG. 2 is a sectional view of the organic TFT array panel shown in FIG. 1 taken along line 2-2'. FIG. 3 is a sectional view of the organic TFT array panel shown in FIG. 1 taken along line 3-3'.

An organic TFT array panel includes a display area DA, a pad area PA located around the display area DA, and an intermediate area IA disposed between the display area DA and the pad area PA.

A plurality of data conductors including a plurality of data lines 171, a plurality of light blocking members 174, and a storage connection 178 are formed on an insulating substrate 110 such as transparent glass, silicone, or plastic.

The data lines 171 transmit data signals and extend substantially in a longitudinal direction in the display area DA. Each data line 171 includes a plurality of projections 173 in the display area DA, and reaches the pad area PA to include an end portion 179 having a large area for contact with another layer or an external driving circuit. A data driving circuit (not shown) for generating the data signals may be mounted on a flexible printed circuit (FPC) film (not shown), which may be attached to the substrate 110, directly mounted on the substrate 110, or integrated onto the substrate 110. The data lines 171 may extend to connect to a driving circuit that may be integrated on the substrate 110.

Light blocking members 174 are disposed in the display area DA.

The storage connection 178 transmits a predetermined voltage such as a common voltage and extends in the longitudinal direction in the intermediate area IA.

The data conductors 171, light blocking members 174, and storage connections 178 are preferably made of metal comprising Al or Al alloy, Ag or Ag alloy, Au or Au alloy, Cu or Cu alloy, Mo or Mo alloy, Cr, Ta or Ti. The conductors may have a multi-layered structure, including two conductive films (not shown) having different physical characteristics. One of the two films preferably comprises metal of low resistivity, such as Al, Ag, or Cu, to reduce signal delay or voltage drop. The other film preferably comprises material such as Mo, Cr, Ta, or Ti, which has good physical, chemical, and electrical contact characteristics with other materials such as indium tin oxide (ITO) or indium zinc oxide (IZO), or good adhesion with the substrate 110. Examples of combinations of the two films are a lower Cr film with an upper Al (alloy) film, and a lower Al (alloy) film with an upper Mo (alloy) film. Note the conductors 171, 174 and 178 may be made of various other metals or conductors.

The conductors 171, 174 and 178 have inclined edge profiles, and the inclination angles are between about 30-80 degrees.

An interlayer insulating layer 160, including lower and upper insulating films 160$p$ and 160$q$, is formed on the conductors 171, 174 and 178. The lower insulating film 160$p$ may be made of an inorganic insulator such as silicon nitride (SiNx) and silicon oxide (SiOx). The upper insulating film 160$q$ may be made of an organic insulator having good durability such as polyacryl, polyimide, and benzocyclobutene (BCB; $C_{10}H_8$). Either the lower or upper insulating film 160$p$ or 160$q$ may be omitted.

The interlayer insulating layer 160 has a plurality of contact holes 162 exposing the end portions 179 of the data lines 171, a plurality of contact holes 163 exposing the projections 173 of the data lines 171, and a plurality of contact holes 168 exposing the storage connection 178.

A plurality of source electrodes 193, a plurality of pixel electrodes 190, and a plurality of contact assistants 82 are formed on the interlayer insulating layer 160. The source electrodes 193 and the pixel electrodes 190 are disposed on the display area DA, and the contact assistants 82 are disposed on the pad area PA. They are preferably made of ITO, particularly amorphous ITO. However, they may be other transparent conductors such as IZO, or reflective conductors such as Ag, Al, Au, or alloys thereof.

The source electrodes 193 are electrically connected to the data lines 171 through the contact holes 163.

Each pixel electrode 190 includes a portion 195 disposed opposite a source electrode 193 with respect to a gate electrode 124. This portion of the pixel electrode is referred to as a drain electrode. The drain electrodes 195 and the source electrodes 193 have serpentine edges that face each other. The edges may be separated from each other by a distance that remains substantially constant for each pair of drain-source electrodes. The pixel electrodes 190 overlap the gate lines 121 and the data lines 171 to increase the aperture ratio.

The contact assistants 82 are connected to the end portions 179 of the data lines 171 through the contact holes 162. The contact assistants 82 protect the end portions 179 and enhance the adhesion between the end portions 179 and external devices.

An insulating layer of material 140 is formed on the source electrodes 193 and the pixel electrodes 190 in the display area DA. The insulating layer of material 140 has a plurality of openings 144 exposing portions of the source electrodes 193 and the drain electrodes 195, including the opposing serpentine edges of the source electrodes 193 and the drain electrodes 195. The insulating layer of material 140 also has a plurality of openings 145 exposing most portions of the pixel electrodes 190.

The insulating layer of material 140 is preferably made of photosensitive organic material such as poly acryl or polyimide, and has a thickness of about 1-3 microns.

A plurality of organic semiconductor islands 154 are placed in the openings 144 of the insulating layer of material 140. The gate electrodes 124 are disposed on the organic semiconductor islands 154 over the light blocking members 174. The islands 154 contact the source electrodes 193 and the drain electrodes 195.

The organic semiconductor islands 154 may include a soluble organic compound such as polythienylenevinylene, oligothiophene, poly 3-hexylthiophene, and soluble pentacene. The organic semiconductor islands 154 can be formed by inkjet printing. The thickness of the organic semiconductor islands 154 ranges from about 500 to about 2,000 Å.

A plurality of gate insulators 146 are formed on the organic semiconductor islands 154, and are confined in the openings 144 with the organic semiconductor islands 154. The gate insulators 146 are preferably made of organic insulators such as a hydrocarbon compound including fluorine, poly vinyl alcohol, or polyimide. The insulators can be formed by inkjet printing.

Since the organic semiconductor islands 154 are fully enclosed by the insulating layer of material 140 and the gate insulators 146, the organic semiconductor islands 154 are protected from damage in the following manufacturing process steps.

A plurality of gate conductors, including gate lines 121 storage electrode lines 131, is formed on the insulating layer 140 and the gate insulators 146.

The gate lines 121 transmit gate signals and extend substantially in a transverse direction in the display area DA. Each of the gate lines 121 includes a plurality of gate electrodes 124 projecting toward the drain and source electrodes. The gate lines 121 reach the pad area PA through the intermediate area IA, and include an end portion 129 having a large area for contact with another layer or an external driving circuit. A gate driving circuit (not shown) for generating the gate signals may be mounted on a FPC film (not shown), which may be attached to the substrate 110, directly mounted on the substrate 110, or integrated onto the substrate 110. The gate lines 121 may extend to connect to a driving circuit that may be integrated on the substrate 110.

The storage electrode lines 131 are supplied with a predetermined voltage. Each of the storage electrode lines 131 includes a stem, a plurality of storage electrodes 133, and an end portion 138. Each of the storage electrode lines 131 is disposed between two adjacent gate lines 121.

The stem extends substantially parallel to the gate lines 121 from the display area DA to the intermediate area IA. The stem is closer to the upper of the two adjacent gate lines 121.

The end portion 138 is disposed in the intermediate area IA, and has a large exposed area to connect to the storage connection 178 through a contact hole 168.

Each storage electrode 133 branches from a stem in the display area DA. Each storage electrode 133 has three sides that, together with the stem, enclose a rectangular area. Note the storage electrode lines 131 may have various shapes and arrangements.

The gate lines 121 and storage electrode lines 131 may be made of the same material as the conductors 171, 174 and 178.

The lateral sides of the gate lines 121 and storage electrode lines 131 are inclined relative to a surface of the substrate 110, and their inclination angles range from about 30 to about −80 degrees.

A gate electrode 124, a source electrode 193, a drain electrode 195, and an organic semiconductor island 154 form an organic TFT Q. The TFT Q has a channel formed in the organic semiconductor island 154 disposed between the source electrode 193 and the drain electrode 195.

The pixel electrodes 190 receive data voltages from the organic TFT Q and generate an electric field in conjunction with a common electrode (not shown) of an opposing display panel (not shown) supplied with a common voltage, which determines the orientations of liquid crystal molecules (not shown) in a liquid crystal layer (not shown) disposed between the two electrodes. A pixel electrode 190 and the common electrode form a capacitor referred to as a "liquid crystal capacitor," which stores applied voltages even after the organic TFT turns off.

The light blocking members 174, which are disposed under the organic semiconductor islands 154, block incident light to prevent current leakage induced by light.

A plurality of passivation members 180 are formed in stripes on the gate conductors 121 and storage electrode lines 131. The passivation members 180 extend to the intermediate area IA, and may have a flat top surface. The passivation members 180 are preferably made of an inorganic or organic insulator. Examples of inorganic insulators include silicon nitride and silicon oxide. Organic insulators may be photosensitive and have a dielectric constant less than about 4.0.

Now, a method of manufacturing the TFT array panel shown in FIGS. 1-3 according to an embodiment of the present invention will be described in detail with reference to FIGS. 4-15B and FIGS. 1-3.

Figure 2:
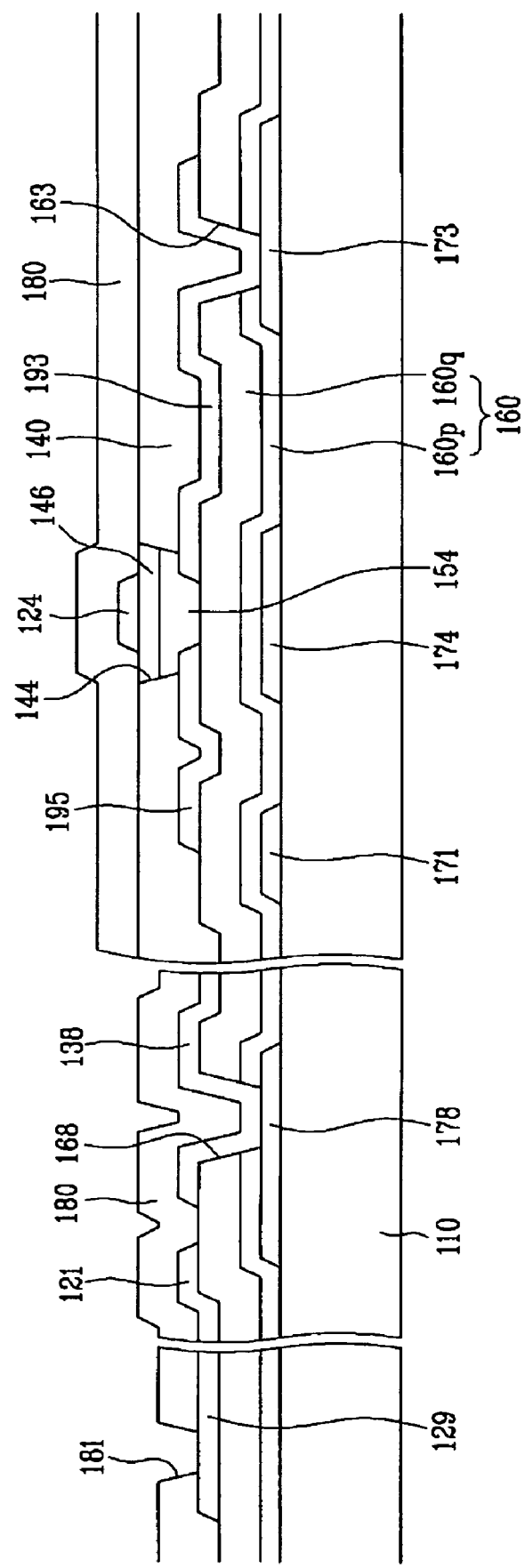
FIG. 2 is a sectional view of the organic TFT array panel shown in FIG. 1 taken along line 2-2'.
Figure 3:
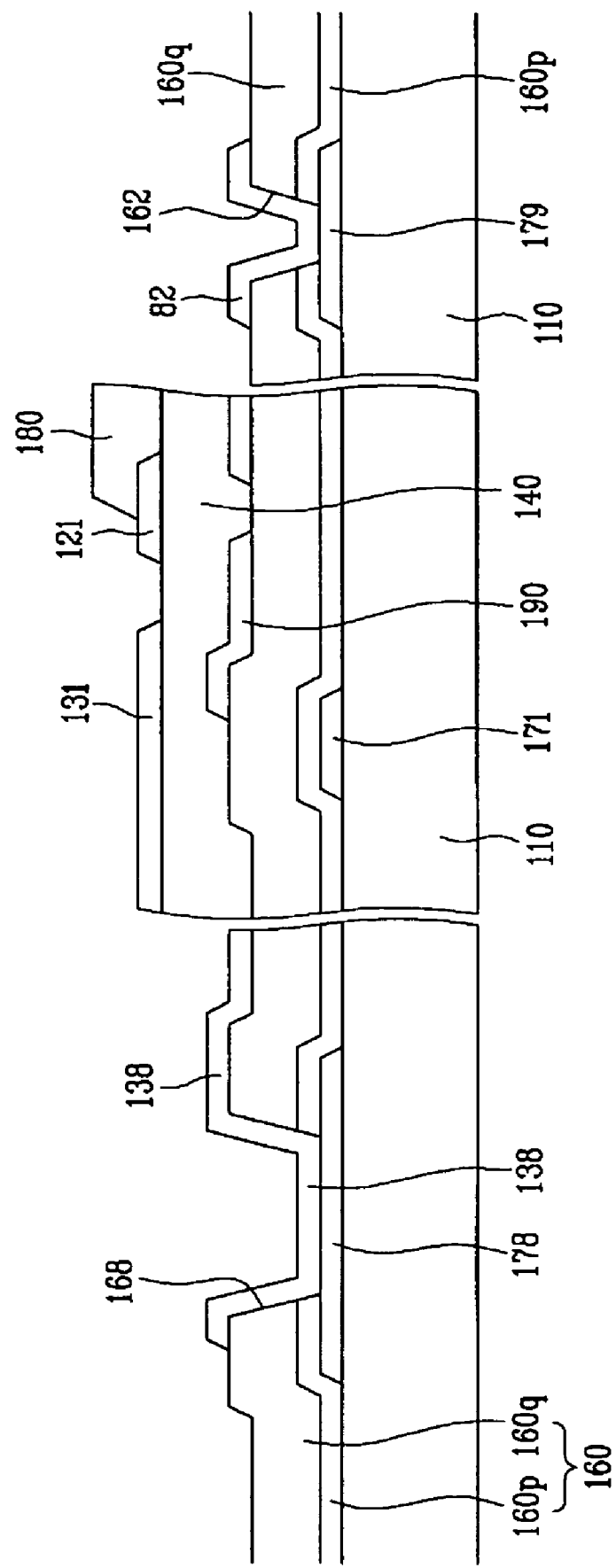
FIG. 3 is a sectional view of the organic TFT array panel shown in FIG. 1 taken along line 3-3'.

FIGS. 4, 6, 8, 10, 12 and 14 are layout views of the organic TFT array panel shown in FIGS. 1-3 during intermediate manufacturing steps, according to the present invention. FIGS. 5A and 5B are sectional views of the TFT array panel shown in FIG. 4 taken along lines 5A-5A' and 5B-5B'. FIGS. 7A and 7B are sectional views of the TFT array panel shown in FIG. 6 taken along lines 7A-7A' and 7B-7B'. FIGS. 9A and 9B are sectional views of the TFT array panel shown in FIG. 8 taken along lines 9A-9A' and 9B-9B'. FIGS. 11A and 11B are sectional views of the TFT array panel shown in FIG. 10 taken along lines 11A-11A' and 11B-11B'. FIGS. 13A and 13B are sectional views of the TFT array panel shown in FIG. 12 taken along lines 13A-13A' and 13B-13B'. FIGS. 15A and 15B are sectional views of the TFT array panel shown in FIG. 14 taken along lines 15A-15A' and 15B-15B'.

Figure 4:
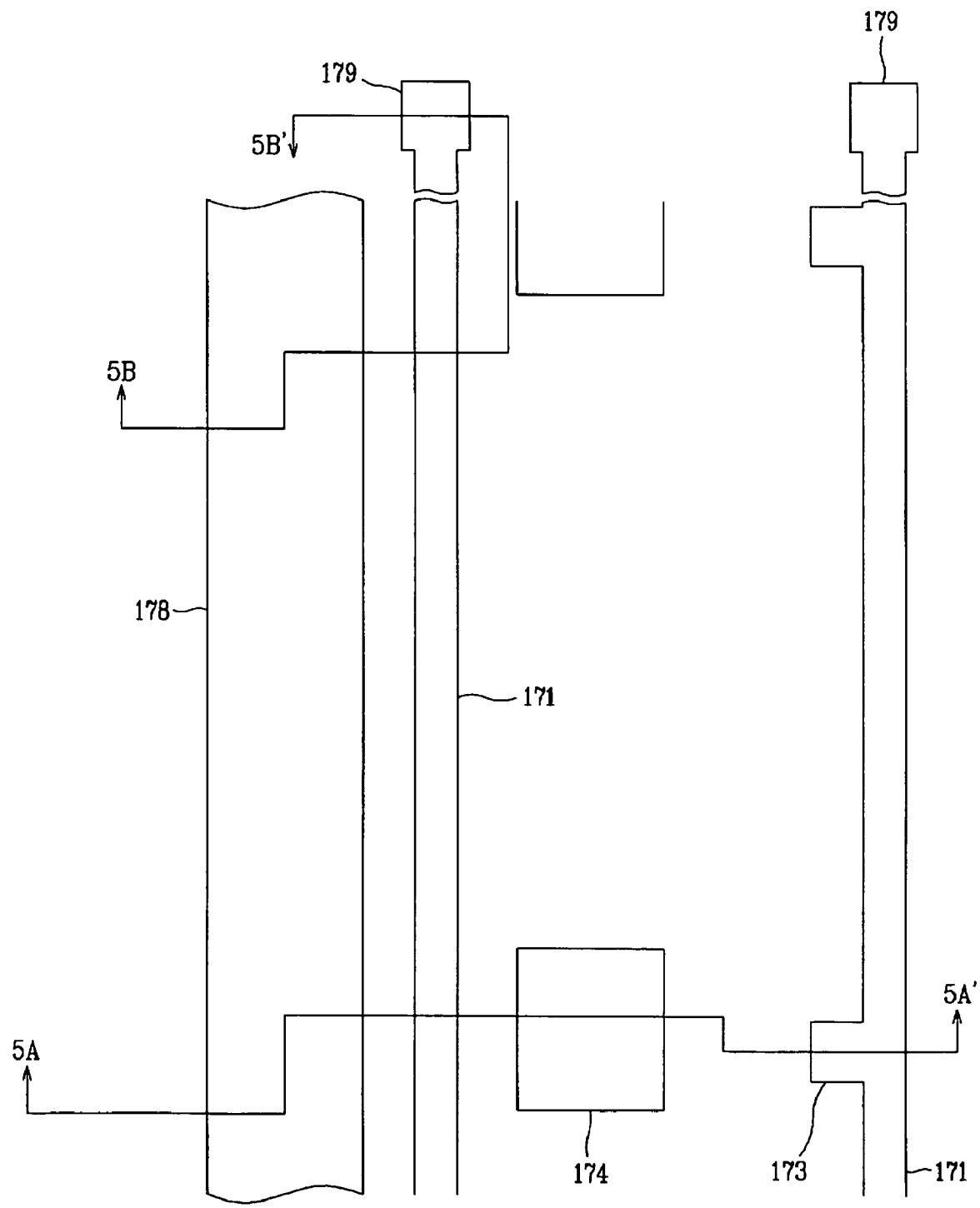
FIGS. 4, 6, 8, 10, 12 and 14 are layout views of the organic TFT array panel shown in FIGS. 1-3 during intermediate steps of a manufacturing method thereof according to an embodiment of the present invention.
Figure 5A:
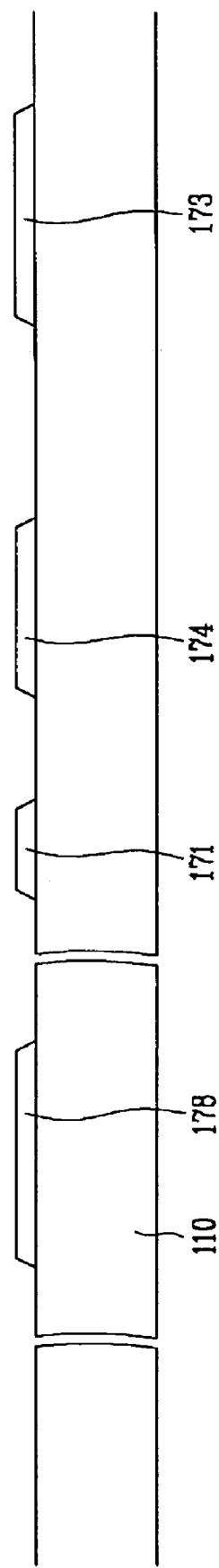
FIGS. 5A and 5B are sectional views of the TFT array panel shown in FIG. 4 taken along lines 5A-5A' and 5B-5B'.
Figure 5B:
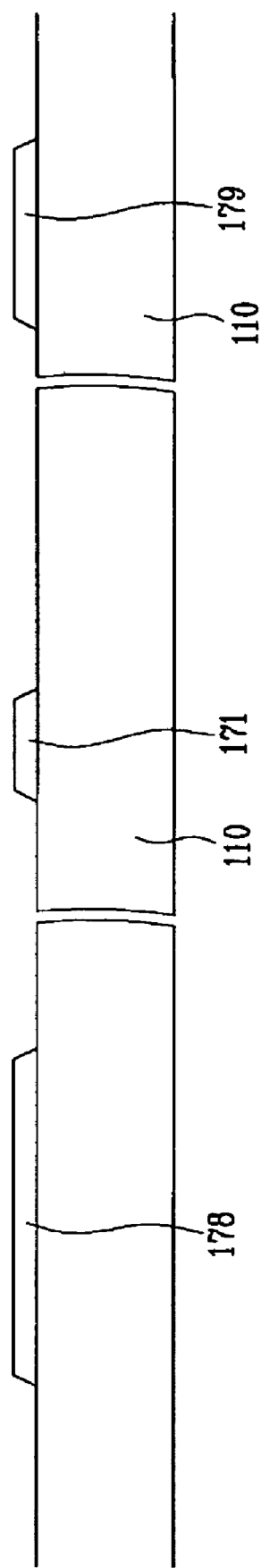

Referring to FIGS. 4-5B, a conductive layer is deposited on a substrate 110 by using sputtering, etc., and patterned by lithography and etch to form a plurality of data lines 171 including projections 173 and end portions 179, a plurality of light blocking members 174, and a storage connection 178.

Figure 6:
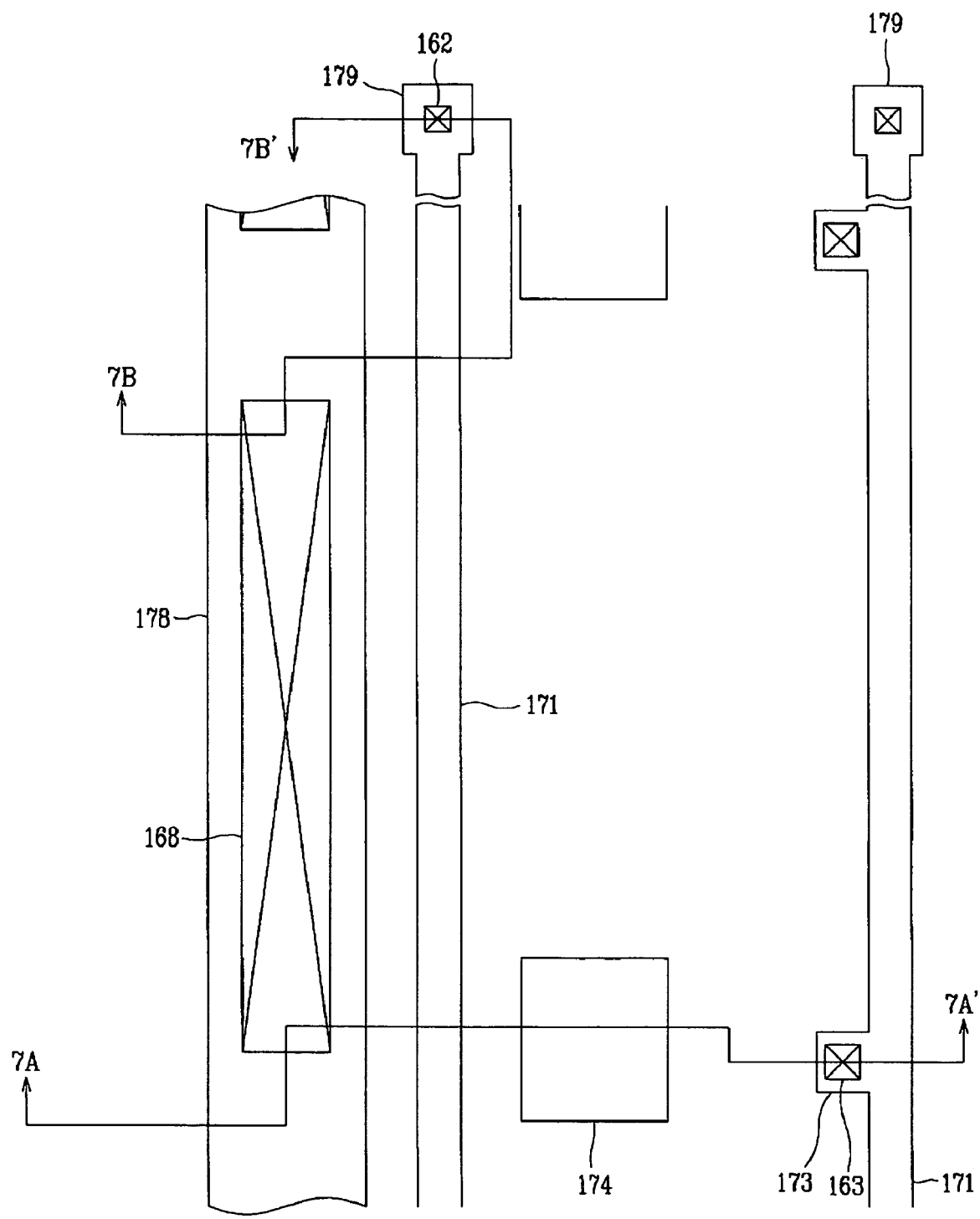
Figure 7A:
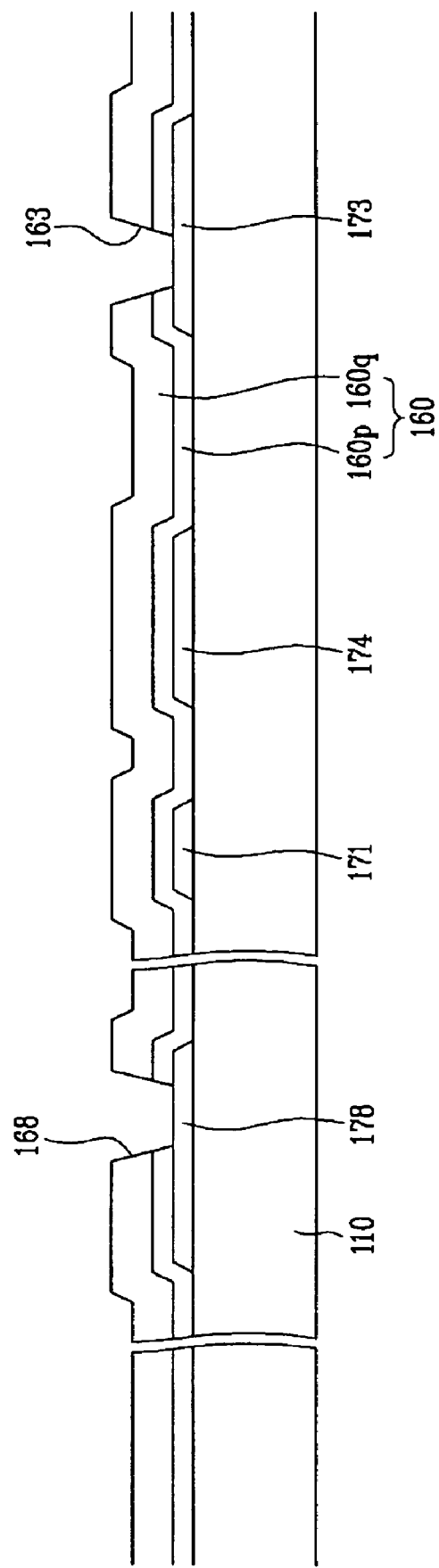

Referring to FIGS. 6-7B, an interlayer insulating layer 160 including lower and upper insulating films 160*p* and 160*q* is deposited. The lower insulating film 160*p* may be made of an inorganic material, and may be deposited by chemical vapor deposition (CVD), etc. The upper insulating film 160*q* may be made of photosensitive organic material and deposited by, for example, spin coating.

The upper insulating film 160*q* is then subjected to light exposure and development to form upper walls of a plurality of contact holes 162, 163 and 168. Thereafter, the lower insulating film 160*p* is dry etched using the upper insulating film 160*q* as an etch mask to complete the contact holes 162, 163 and 168.

Figure 8:
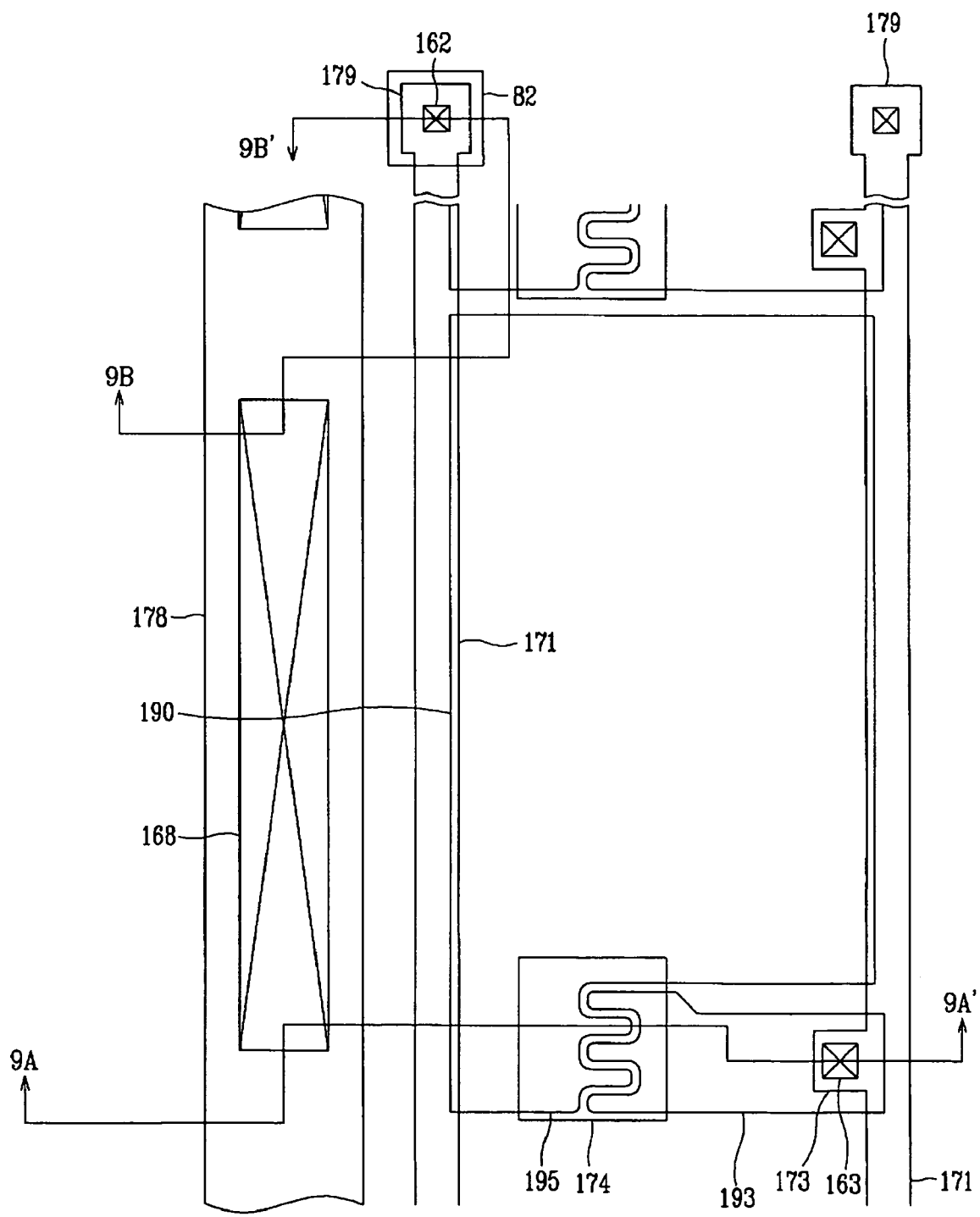
Figure 9A:
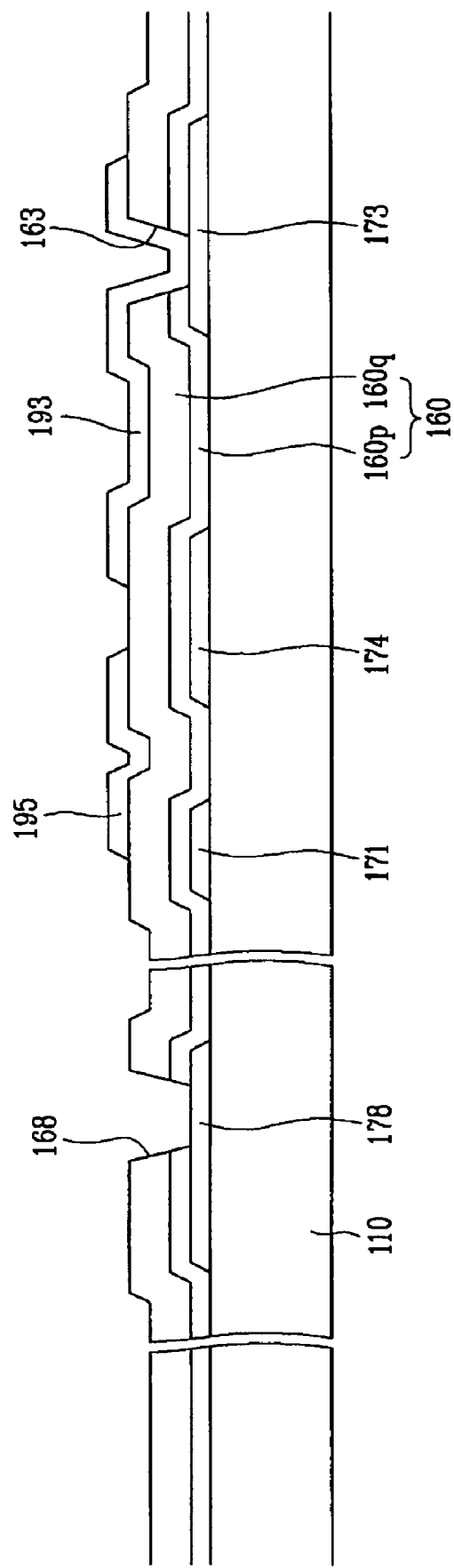
FIGS. 9A and 9B are sectional views of the TFT array panel shown in FIG. 8 taken along lines 9A-9A' and 9B-9B'.
Figure 9B:
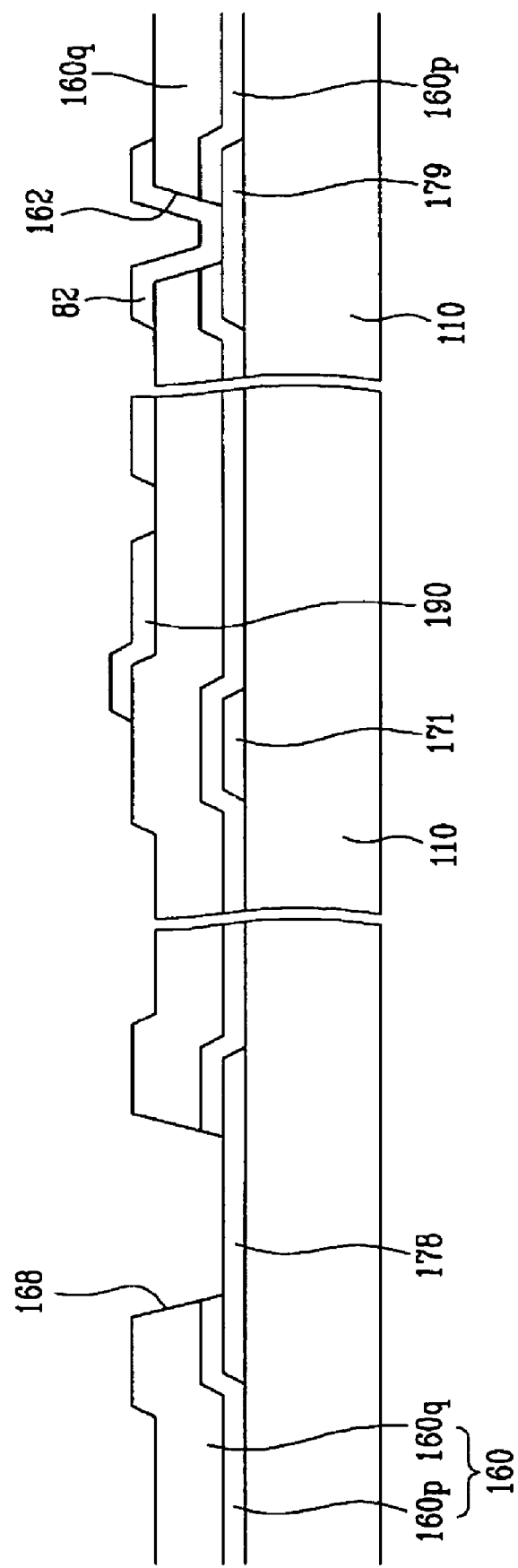

Referring to FIGS. 8-9B, an amorphous ITO layer is deposited on the upper insulating film 160*q* and patterned by lithography and wet etch with an etchant to form a plurality of source electrodes 193, a plurality of pixel electrodes 190 including drain electrodes 195, and a plurality of contact assistants 82.

The deposition of the amorphous ITO layer may be performed at a temperature lower than about 80° C., preferably at room temperature. The etchant for the amorphous ITO layer may include a weak alkaline etchant containing amine ($NH_2$) to reduce the damage on the interlayer insulating layer 160. Optionally, annealing may be performed to convert the amorphous ITO into crystalline ITO.

Figure 10:
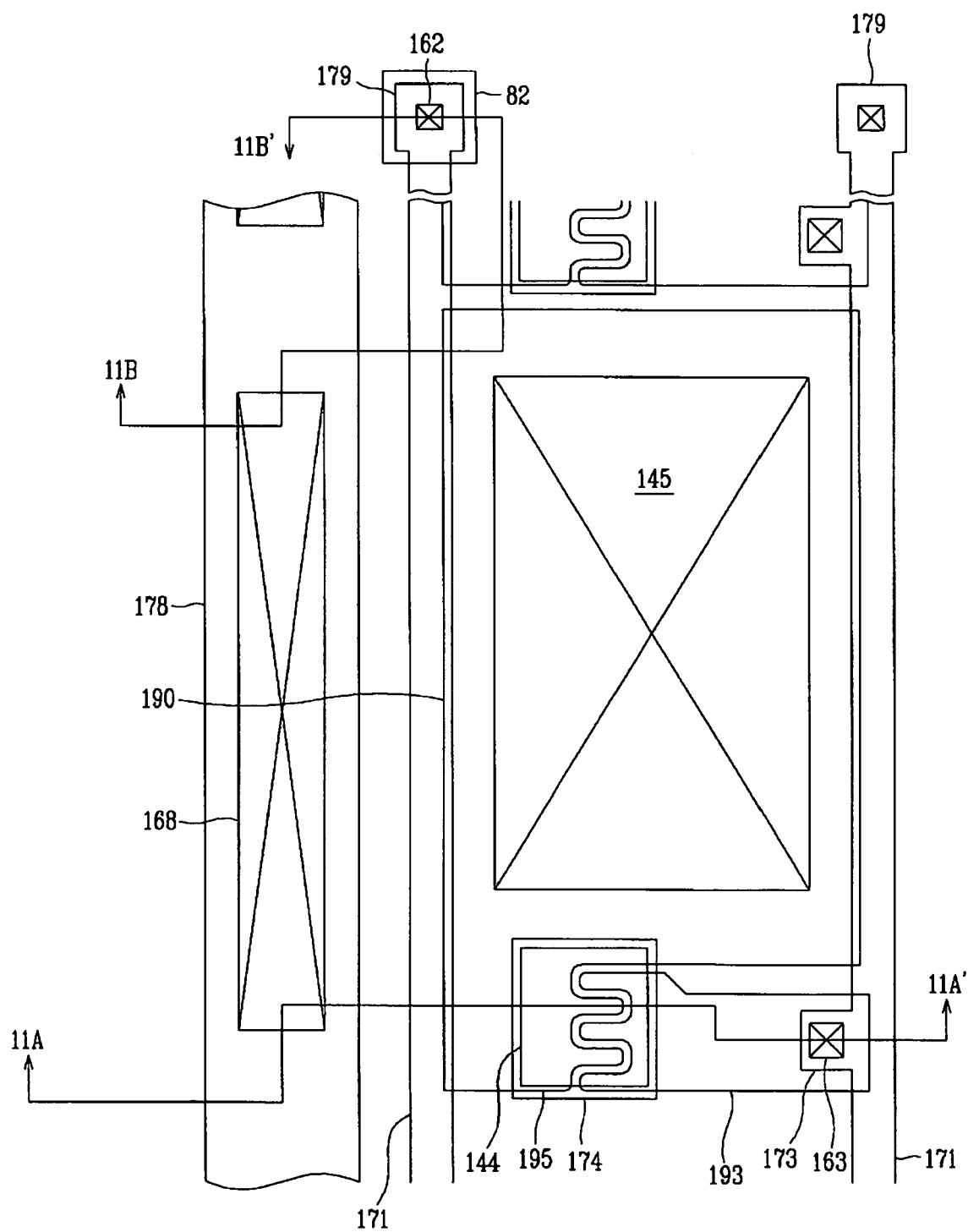
Figure 11A:
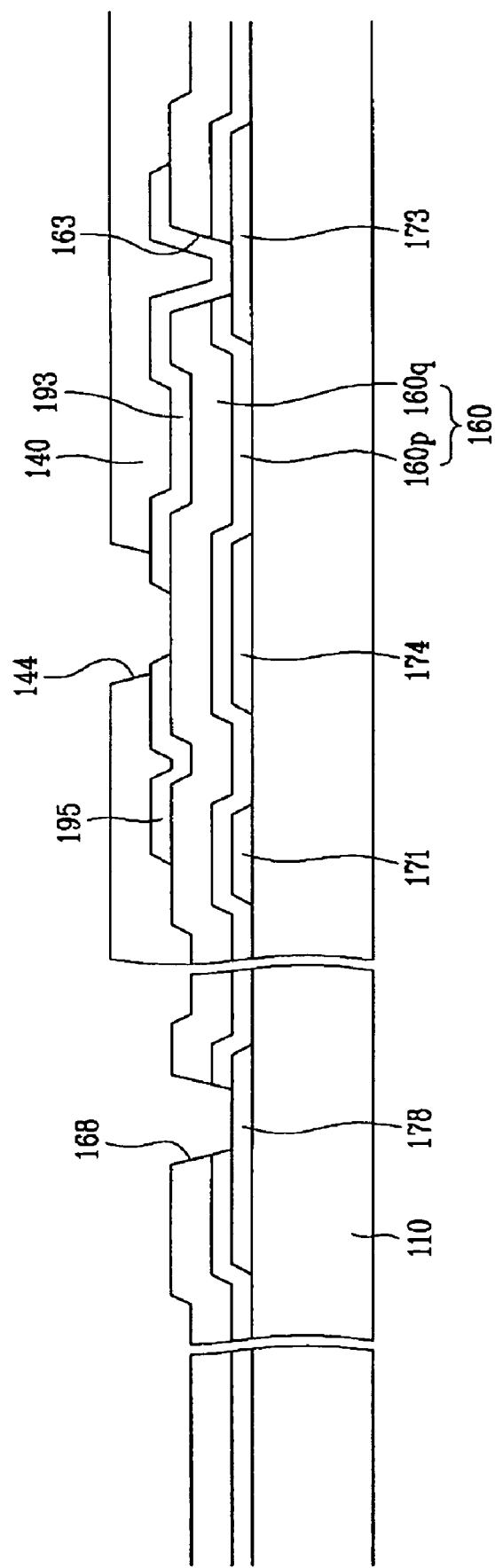
FIGS. 11A and 11B are sectional views of the TFT array panel shown in FIG. 10 taken along lines 11A-11A' and 11B-11B'.
Figure 11B:
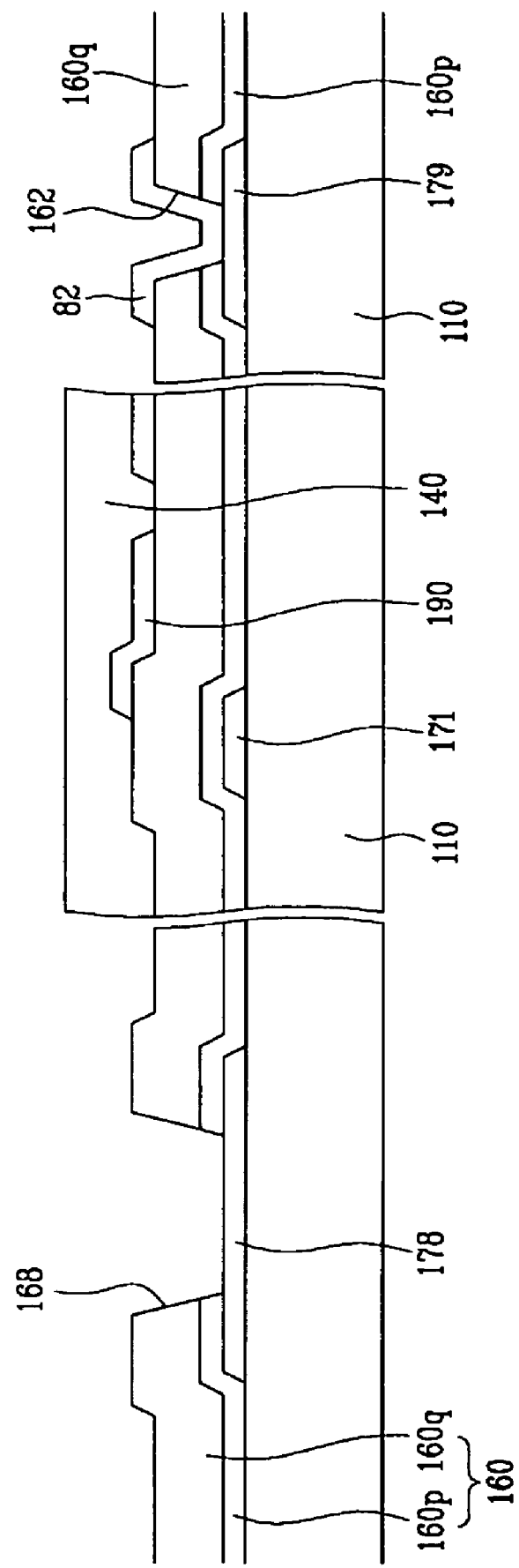

Referring to FIGS. 10-11B, a photosensitive insulating layer having a thickness of about 1-3 microns is (spin) coated, and is exposed to light and developed to form an insulating layer of material 140 having a plurality of openings 144 exposing portions of the source electrodes 193, the drain electrodes 195, and a plurality of openings 145 exposing most portions of the pixel electrodes 190.

Figure 12:
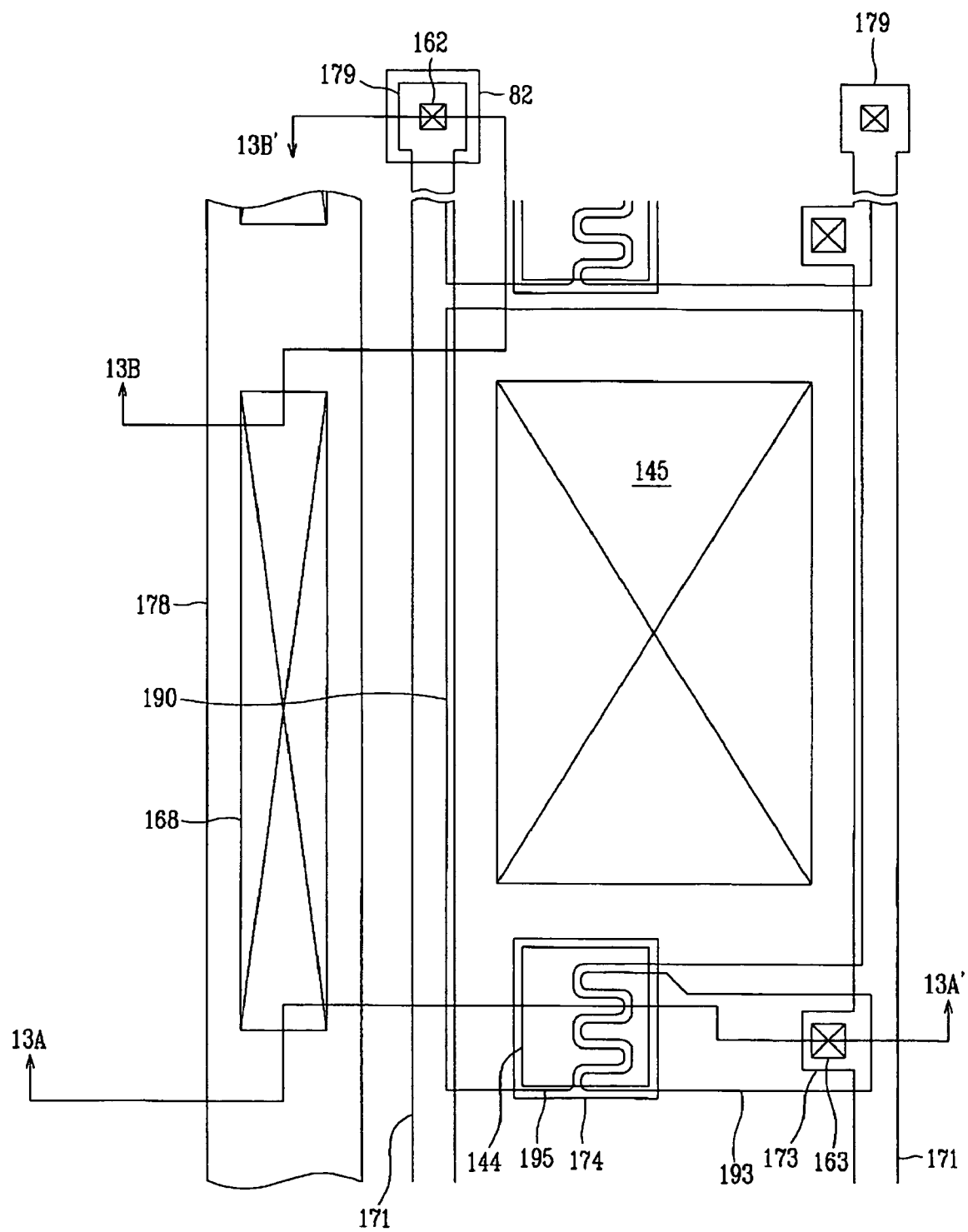
Figure 13A:
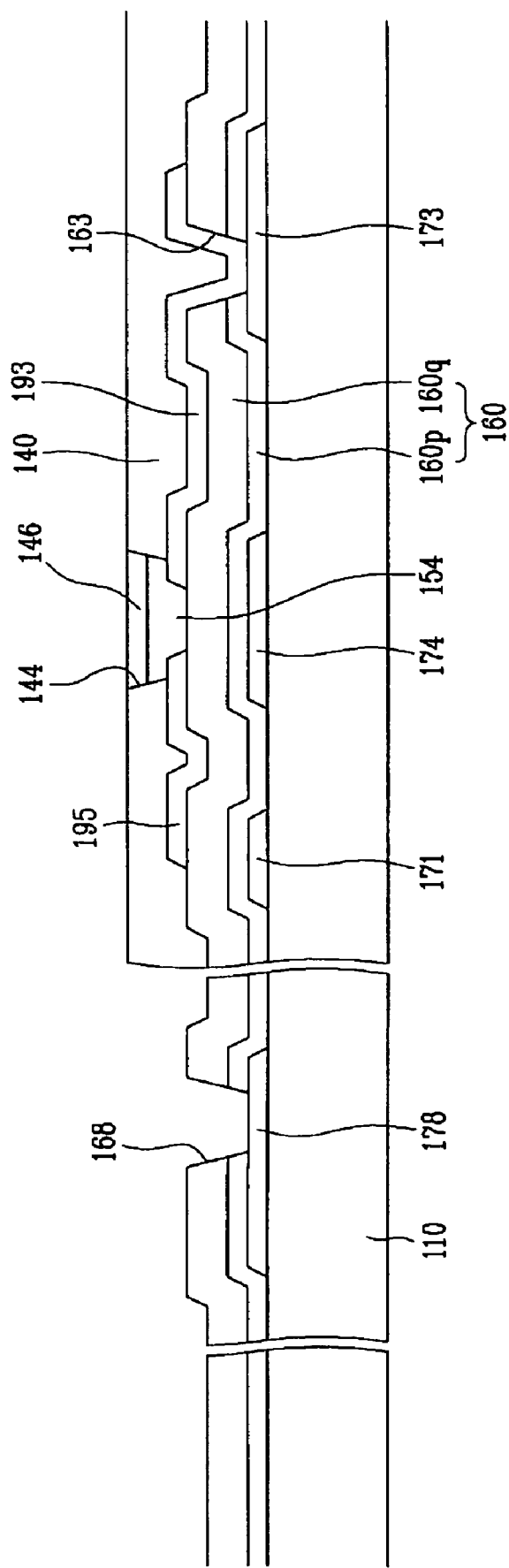
FIGS. 13A and 13B are sectional views of the TFT array panel shown in FIG. 12 taken along lines 13A-13A' and 13B-13B'.
Figure 13B:
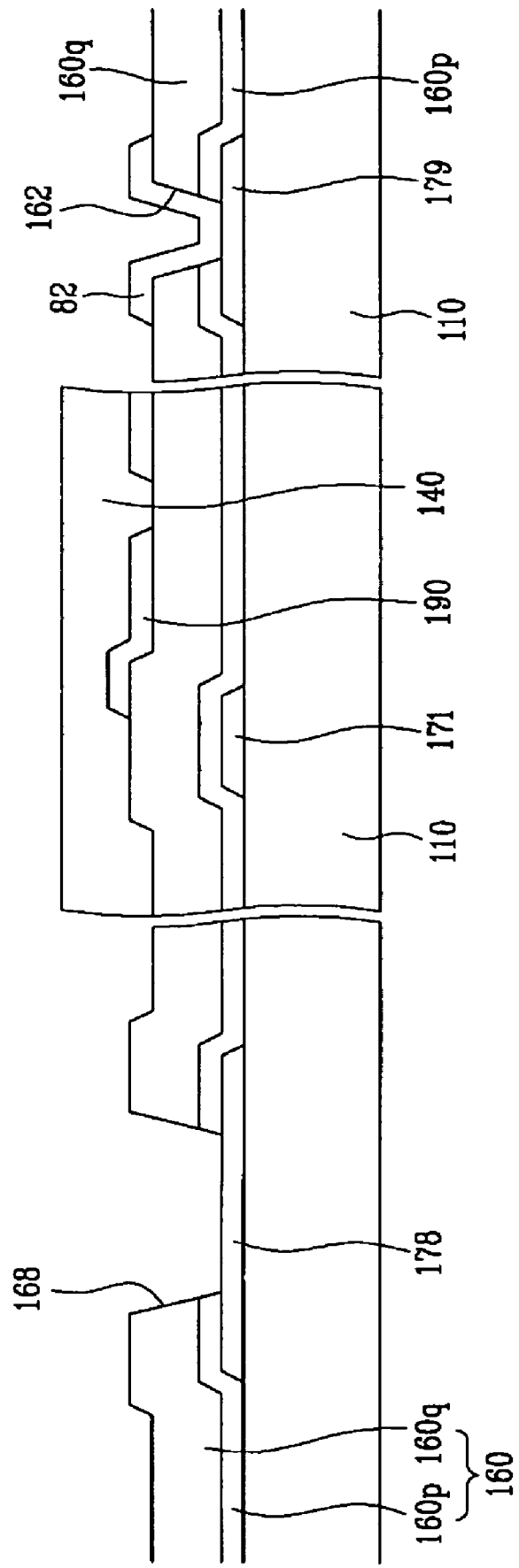

Referring to FIGS. 12-13B, a plurality of organic semiconductor islands 154 are formed in the openings 144 by inkjet printing organic semiconductor material dissolved in a solvent, followed by thermal treatment at a temperature of about 50-150° C. to remove the solvent.

Next, a plurality of gate insulators 146 is formed on the organic semiconductor islands 154 in the openings 144 by inkjet printing organic insulating material dissolved in a solvent, followed by thermal treatment at a temperature of about 100-250° C. to remove the solvent.

In this way, the organic semiconductor islands 154 are fully enclosed by the insulating layer of material 140 and gate insulators 146, such that the organic semiconductor islands 154 are protected from damage in following process steps. In addition, the inkjet deposition of the gate insulators 146 and organic semiconductor islands 154 improves the surface characteristics of the channels in the organic TFTs.

Figure 14:
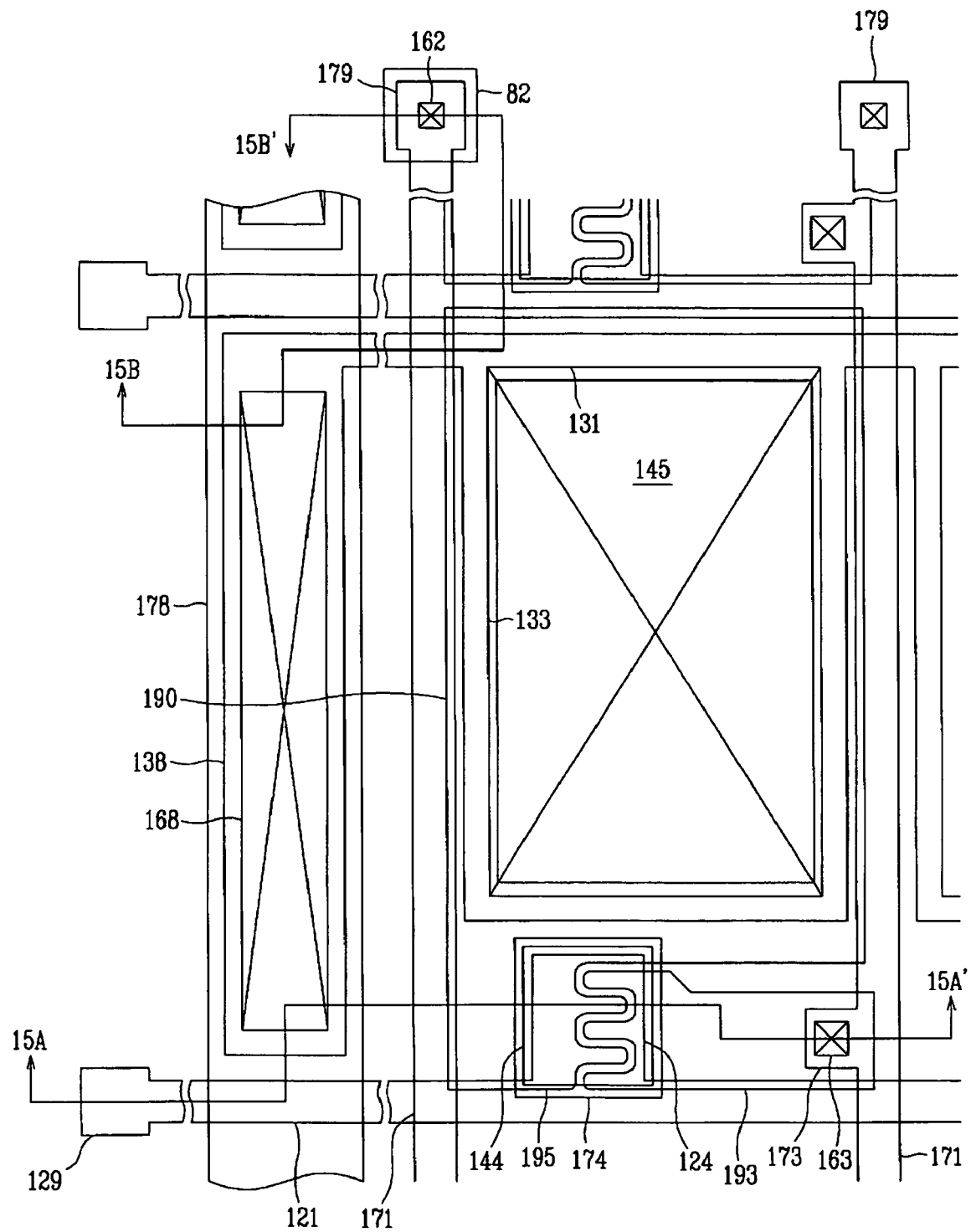
Figure 15A:
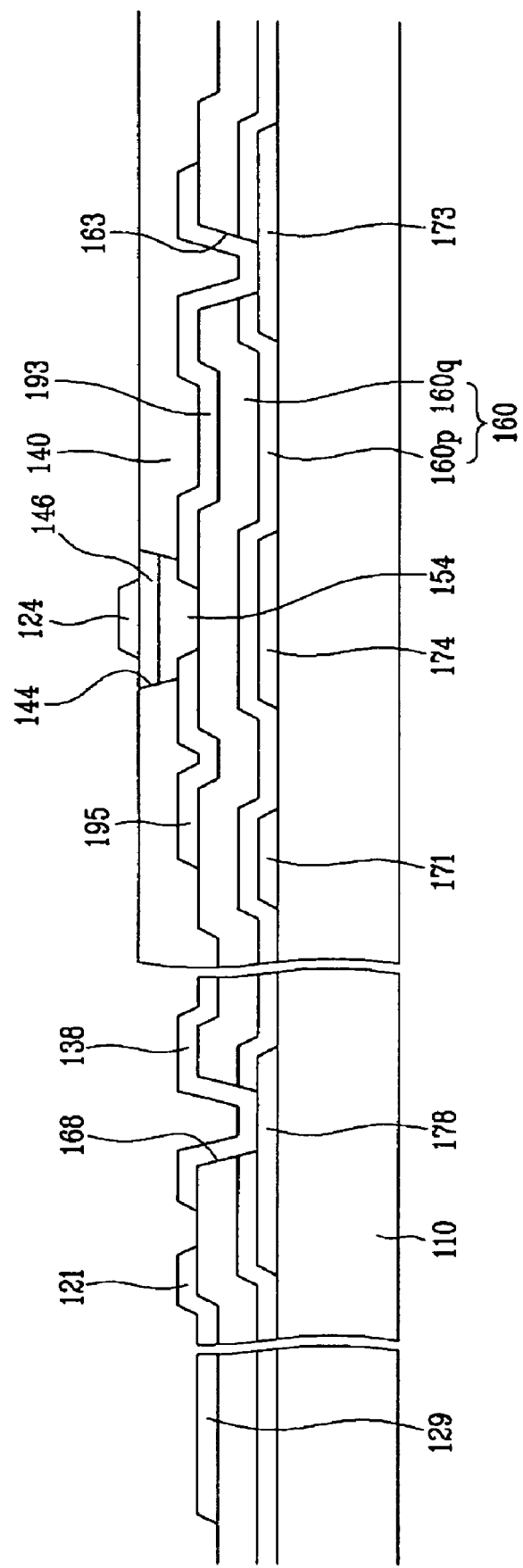
FIGS. 15A and 15B are sectional views of the TFT array panel shown in FIG. 14 taken along lines 15A-15A' and 15B-15B'.
Figure 15B:
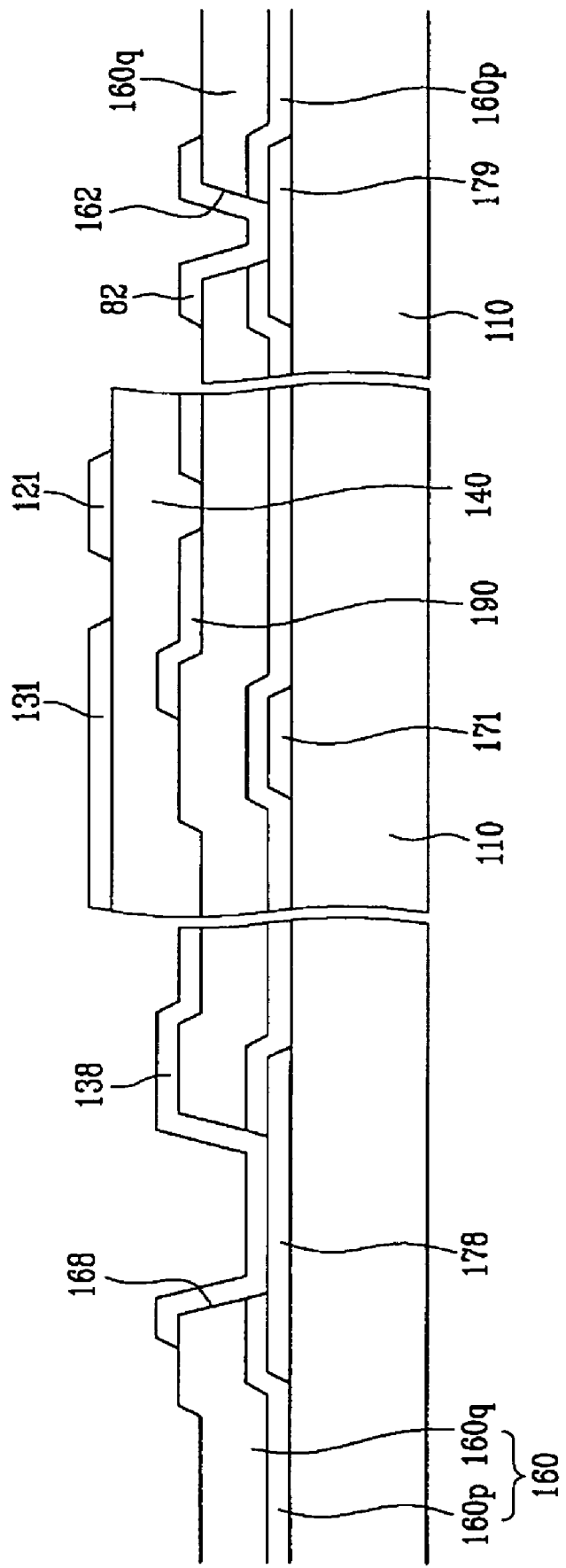

Referring to FIGS. 14-15B, a conductive layer is deposited on the insulating layer of material 140 and gate insulators 146. The conductive layer is patterned by lithography and etch to form a plurality of gate lines 121 with gate electrodes 124 with end portions 129, and a plurality of storage electrode lines 131 with storage electrodes 133 and end portions 138. The end portions 138 of the storage electrode lines 131 are connected to the storage connection 178 through the contact holes 168.

Finally, an insulating layer is deposited and patterned to form a plurality of passivation members 180 as shown in FIGS. 1-3.

The present invention can be employed in any display device, including an LCD or an OLED display.

Although preferred embodiments of the present disclosure of invention have been described in detail hereinabove, it should be clearly understood that many variations and/or modifications of the basic inventive concepts herein taught which may appear to those skilled in the present art after having read the present disclosure will still fall within the spirit and scope of the present teachings even if not explicitly defined as part of a specific one of the preferred embodiments.

What is claimed is:

1. An organic thin film transistor array panel comprising:
   a substrate;
   a data line disposed over the substrate;
   an insulating layer disposed over the data line and having a contact hole extending to the data line;
   a first electrode disposed over the insulating layer and connected to the data line through the contact hole;
   a second electrode disposed over the insulating layer;
   an electrically insulative material having an opening defined therein and disposed over the insulating layer, the first electrode and the second electrode, where the opening exposes the first and second electrodes;
   an island-shaped semiconductor disposed inside and contained by the opening, the island-shaped semiconductor being disposed over the exposed first and the second electrodes and having an outer boundary of its island shape defined by said opening which contains it;
   an island-shaped gate insulator disposed inside and contained by the opening, the island-shaped gate insulator being disposed over the island-shaped semiconductor and having an outer boundary of its island shape defined by said opening which contains it; and
   a gate electrode disposed on the island-shaped gate insulator;
   wherein at least one of the island-shaped semiconductor and the island-shaped gate insulator is composed of a respective organic material.

2. The organic thin film transistor array panel of claim 1, wherein the electrically insulative material which has the opening defined therein comprises an insulating organic material formed from a light sensitive and developed material.

3. The organic thin film transistor array panel of claim 1, wherein the island-shaped semiconductor comprises polythienylenevinylene, oligothiophene, poly 3-hexylthiophene, or soluble pentacene.

4. The organic thin film transistor array panel of claim 1, wherein both of the island-shaped semiconductor and the island-shaped gate insulator are composed of respective organic materials and wherein the island-shaped gate insulator comprises a hydrocarbon compound including fluorine, polyvinyl alcohol, or polyimide.

5. The organic thin film transistor array panel of claim 1, wherein the insulating layer comprises a silicon nitride film and an organic film.

6. The organic thin film transistor array panel of claim 1, further comprising a light blocking member disposed under the island-shaped semiconductor.

7. The organic thin film transistor array panel of claim 6, wherein the light blocking member is conductive.

8. The organic thin film transistor array panel of claim 7, wherein the light blocking member and the data line are formed in the same layer.

9. The organic thin film transistor array panel of claim 1, further comprising a passivation member disposed on the gate electrode.

10. The organic thin film transistor array panel of claim 1, wherein the gate electrode extends from a gate line, said panel further comprising:
    a storage connection disposed on the substrate; and
    a storage electrode line disposed on the same layer as the gate line and connected to the storage connection.

11. A thin film transistor comprising:
    a substrate;
    a conductor disposed over the substrate;
    a first insulating layer disposed over the conductor and over the substrate, wherein a contact hole extends through the first insulating layer and exposes a portion of the conductor;
    a first electrode disposed over the first insulating layer and electrically connected through the contact hole to the portion of the conductor exposed by the contact hole;
    a second electrode disposed over the first insulating layer;
    a second insulating layer having an opening defined therein, the second insulating layer being disposed over the first insulating layer, the first electrode and the second electrode, where the opening exposes the first and second electrodes;
    a semiconductor island disposed inside and contained by the opening, where the semiconductor island extends between the first electrode and the second electrode and contacts both of the opening exposed first and second electrodes;
    a gate insulator disposed inside and contained by the opening, the gate insulator being aligned by the opening so as to be and disposed over the semiconductor island; and
    a gate electrode disposed over the gate insulator.

12. The thin film transistor of claim 11, wherein the first electrode is a source electrode and the second electrode is a drain electrode.

13. The thin film transistor of claim 11, wherein the second insulating layer comprises an organic material.

14. The thin film transistor of claim 11, wherein the first electrode and the second electrode have edges that are separated from each other by a substantially uniform distance.

15. The thin film transistor of claim 14, wherein the edges are curvilinear in shape.

16. The thin film transistor of claim 15, wherein the edges are serpentine in shape.

17. An organic thin film transistor array panel comprising multiple transistors, wherein each of the transistors is a thin film transistor in accordance with claim 11, and wherein the conductor of each thin film transistor is a data line.

* * * * *